(12) United States Patent
Renner

(10) Patent No.: US 7,773,015 B2
(45) Date of Patent: Aug. 10, 2010

(54) MEASUREMENT DATA ACQUISITION APPARATUS AND METHOD OF OPERATION THEREOF

(76) Inventor: Peter Renner, Heiligenstock 2, D-51515 Kürten (DE)

( * ) Notice: Subject to any disclaimer, the term of this patent is extended or adjusted under 35 U.S.C. 154(b) by 0 days.

(21) Appl. No.: 12/169,195

(22) Filed: Jul. 8, 2008

(65) Prior Publication Data

US 2009/0273496 A1 Nov. 5, 2009

(30) Foreign Application Priority Data

May 5, 2008 (EP) ................................ 08103812

(51) Int. Cl.
*H03M 1/00* (2006.01)
(52) U.S. Cl. ..................... 341/141; 702/91; 702/123
(58) Field of Classification Search ......... 341/140–155; 702/91, 123
See application file for complete search history.

(56) References Cited

U.S. PATENT DOCUMENTS 5,918,194 A * 6/1999 Banaska et al. ............... 702/91
6,594,612 B2 * 7/2003 Moch ......................... 702/123

* cited by examiner

*Primary Examiner*—Lam T Mai
(74) *Attorney, Agent, or Firm*—Grossman, Tucker, Perreault & Pfleger, PLLC

(57) ABSTRACT

To avoid the measurement disturbances occurring in a conventional, multi-channel measurement data acquisition apparatus there is proposed a multi-channel measurement data acquisition apparatus which includes at least one analog input assembly having a plurality of analog inputs, a controllable electronic analog signal switch device (12) and a central controllable analog-digital converter, wherein the channels of the analog inputs can be successively switched through by means of the analog signal switch device so that the analog signals at the inputs of the individual channels are successively applied as input signals to the central analog-digital converter, and wherein the electronic analog signal switch device and/or the analog-digital converter have control inputs connected to associated control lines.

12 Claims, 4 Drawing Sheets

MEASUREMENT DATA ACQUISITION APPARATUS AND METHOD OF OPERATION THEREOF

Figure 1:
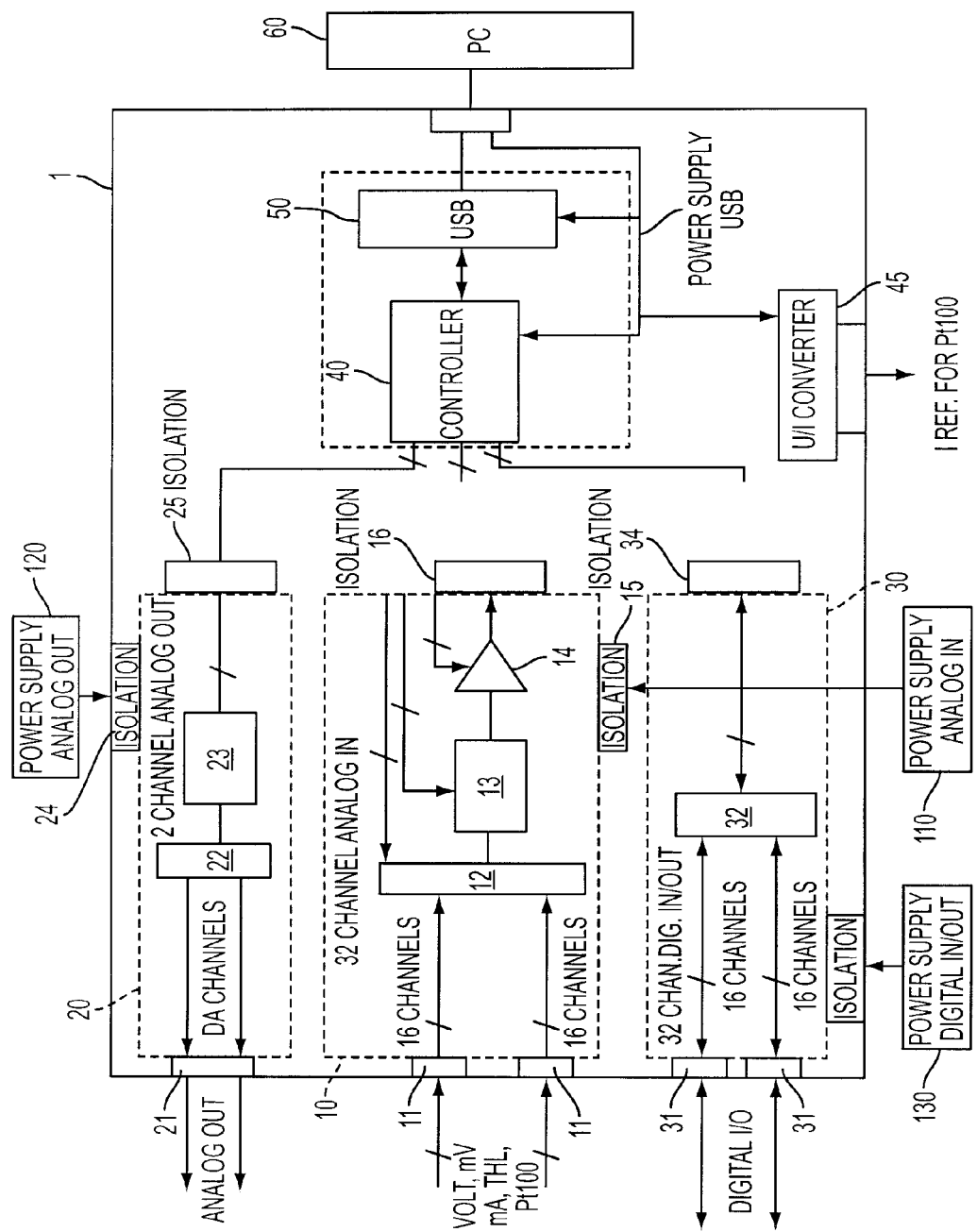

The invention concerns a multi-channel measurement data acquisition apparatus which includes at least one analog input assembly having a plurality of analog inputs, a controllable electronic analog signal switch device and a central controllable analog-digital converter, wherein the channels of the analog inputs can be successively switched through by means of the analog signal switch device so that the analog signals at the inputs of the individual channels are successively applied as input signals to the central analog-digital converter, and wherein the electronic analog signal switch device and/or the analog-digital converter have control inputs connected to associated control lines. The invention further concerns a method of operating such a multi-channel measurement data acquisition apparatus.

Such measurement data acquisition units are used in particular in monitoring and controlling technical processes. In that respect specific sensors are used for acquiring predetermined physical parameters such as temperatures, pressure, through-flow rates or vibration amplitudes, the sensors generally producing analog signals in respect thereof, which are passed from the measurement data acquisition unit after a possible analog amplification to an analog-digital conversion means and are thereafter available in the form of a digital signal for subsequent data processing, display, storage and so forth.

The analog inputs of conventional measurement data acquisition units can frequently be switched over between the modes 'single ended' and 'difference input'. In the first-mentioned mode the analog inputs are in relation to ground, in which respect it is assumed that the ground of the sensor is identical to the ground of the measurement data acquisition unit. In that way it is sufficient if each sensor is connected to the measurement data acquisition unit only with a single line. When a sensor is connected to a measurement data acquisition unit in such a fashion, there is no protection from ground loops, the occurrence of which seriously adversely impair the quality of measurement data acquisition.

For the purposes also of avoiding the risk of ground loops it is possible in the case of conventional measurement data acquisition units to select the mode 'difference input' in which the measurement signals are fed to the input of the measurement data acquisition unit in double-pole relationship. In this case electromagnetic stray interference effects occur simultaneously on both wires so that external interference phenomena of that kind are substantially compensated. In comparison however that mode also does not afford secure protection from impedance coupling effects due to ground loops. It is frequently necessary for measurement signals which involve large potential differences to be galvanically decoupled. In the ideal situation all sensors to be connected to the measurement data acquisition unit are to be galvanically decoupled, which entails a high level of apparatus complication and expenditure and which in addition can reduce the level of measurement accuracy.

The object of the invention is to so develop conventional measurement data acquisition units that the described disadvantages can be at least partially overcome.

The invention surprisingly attains the foregoing object by a multi-channel measurement data acquisition apparatus having the features set forth in claim 1. In the apparatus according to the invention the supply voltage of the analog input assembly, the control lines of the electronic analog signal switch device and of the analog-digital converter as well as the output of the analog-digital converter are respectively galvanically decoupled from ground so that after an analog signal is switched through to the analog-digital converter the analog input assembly assumes the ground reference of the switched-through analog signal. In that respect the analog input assembly, in particular the control lines of the analog signal switch device and the analog-digital converter, as well as the output of the analog-digital converter, are each potential-free so that, after coupling of the respective sensor output to the input of the analog-digital converter, they have the same coupling to ground as the analog signal and the sensor output respectively. In that way it is possible to reliably eliminate any ground loops. The multi-channel measurement data acquisition apparatus according to the invention is respectively 'set' to the analog signal which is just to be converted so that impedance coupling due to ground loops between the sensor and the measurement data acquisition apparatus is avoided. Furthermore, with the measurement data acquisition apparatus according to the invention, the admissible potential differences can be substantially increased, which makes it possible to use the apparatus in process technology.

The term 'galvanically coupled' means here that there is an ohmic connection existing between two conductor points. In a corresponding fashion the expression 'galvanically decoupled', in relation to a connection, describes a state in which the connection is effected either optically, inductively or capacitively. The expression 'potential decoupled' (potential unlinked) occurs when a high resistance is connected in a path between two circuit portions which can be at different potentials, and that path has a dielectric strength which is higher than the admissible potential differences. Both the circuitry 'galvanically decoupled' and also the circuitry 'potential-decoupled' are referred to hereinafter as 'potential-free', in which respect however it is pointed out that complete decoupling is afforded only by galvanic decoupling and in that respect is to be preferred.

Advantageous embodiments are set forth in the appendant claims.

It can desirably be provided that the controllable electronic analog signal switch device (electronic multiplexer) has between its individual analog signal switches a dielectric strength which is greater than the admissible potential difference between the individual channels. Such a configuration makes it possible to improve the quality of measurement value acquisition as crosstalk of the channels in the multiplexer is avoided.

Desirably the measurement data acquisition apparatus according to the invention includes an analog output assembly having a plurality of analog outputs and a digital I/O assembly, wherein the analog output assembly and the digital I/O assembly are galvanically decoupled in relation to the analog input assembly. That structural measure ensures that there are also no ground loops between the analog output assembly which is possibly provided, and the digital I/O assembly, in relation to the analog input assembly. It is possible in that way to reliably avoid measurement value falsifications caused by ground loops or indeed destruction of the apparatus.

In a further desirable embodiment it can be provided that the analog output assembly and the digital I/O assembly are admittedly not galvanically decoupled in relation to the analog input assembly, but are at least potential-decoupled, that is to say have high separation potentials.

Desirably the measurement data acquisition apparatus according to the invention has a predetermined number of connecting devices, that is less than the total number of the inputs and outputs of the included input/output assemblies, wherein the connecting devices can be configuratably, in particular freely configuratably, connected to the inputs and outputs of the included input/output assemblies. That structural measure eliminates the problem of the discrepancy between the space requirement for the electronics and the space requirement for the connecting terminals in the case of conventional measurement value acquisition apparatuses. By virtue of handling or standardisation factors, the connecting terminals cannot be miniaturised just as desired, whereas the electronics used in measurement value acquisition apparatuses of that kind occupy only little space so that the size of the respective apparatus is substantially determined by the number of terminals. On the other hand the size of the apparatus is generally limited so that a compromise has to be found between the number of connecting terminals and the structural size of the apparatus. The described problem is overcome with the measurement data acquisition apparatus according to the invention in that there is provided a smaller number of connecting terminals in comparison with the number of input/output channels, while the association of the channels with the connecting devices is configuratable. In that way the measurement data acquisition apparatus according to the invention can be flexibly adjusted in relation to the respective prevailing factors involved.

It is particularly desirable if the connecting devices can be switched by means of an electronic controllable switching device to the inputs and outputs of the included input/output assemblies. In another, less expensive embodiment the connections between the connecting devices and the input/output assemblies can be selectively implemented by hand by the user, for example by means of flat ribbon cables, to the ends of which are fitted plugs which can be connected to plug devices of a complementary configuration in the connecting devices and the input/output assemblies respectively.

In a particularly desirable embodiment there are provided releasable connections between the connecting devices and the inputs and outputs of the included input/output assemblies, wherein the analog input channels and the digital inputs and outputs are each distributed half to the connecting devices.

The flexible association according to the invention of the output terminals with the respective input/output assemblies makes it possible to provide that a single device provides the functionality of a plurality of devices. If for example three measurement data acquisition apparatuses are required, one with 32 analog inputs, one with 32 digital in/outputs and one with 16 analog inputs and 16 digital in/outputs, that functionality can be implemented by a single measurement data acquisition apparatus according to the invention, in which the respective connecting devices are associated with the respective input/output assemblies by means of cable or controllable switching device.

It may be desirable if the measurement data acquisition apparatus has a predetermined number of connecting devices, of which at least two are thermally coupled with a low heat-transmission resistance to a heat-conductive plate. In that case there can be provided a single sensor for measuring the temperature of the plate, wherein the at least two connecting devices are adapted for the connection of thermocouple elements and wherein measurements of the at least two connected thermocouple elements are calculated with the temperature value substantially at the same time of the temperature sensor at the plate for ascertaining absolute temperature values. By virtue of such a configuration a measurement data acquisition apparatus can be set up for connection to a plurality of thermocouple elements, wherein the connection comparison locations of the thermocouple elements are thermally coupled to the heat-conductive plate so that the comparative temperature for all connected thermocouple elements can be ascertained by a single temperature sensor, and that reduces the component complication and expenditure. That advantage manifests itself in particular in a measurement data acquisition apparatus which is adapted solely for the connection of thermocouple elements and to which all connecting devices are thermally coupled to the plate and to which in that respect the comparison locations of all thermocouple elements are coupled. A single temperature sensor for measuring the temperature of the plate is sufficient to ascertain the comparative temperature for all connected thermocouple elements.

Desirably it can be provided that the measurement data acquisition apparatus of the invention includes at least one current reference source which supplies a constant current, wherein that constant current is fed outwardly by way of an output port, in particular for providing the constant current for a temperature-dependent resistor. In that way the apparatus can also be used for connection to a temperature-dependent resistor such as a PT100, wherein the resistor has current from the current source at the apparatus side flowing therethrough and the voltage drop at the PT100, which is a measurement in respect of the temperature of the resistor, are detected by means of the analog input assembly.

In order to be able to provide a high degree of flexibility for the measurement data acquisition apparatus according to the invention to the respectively connected sensor, it can be provided that there is provided a program for controlling the apparatus by a control device, an interface controller such as a USB controller and/or a PC connected to the apparatus by way of the USB controller.

For that purpose the program can present the user with dialogs which enable him to configure each channel individually, in which case the configuration operation is substantially determined by which sensors are connected to the individual analog inputs. Preferably the software can be so set up that, in dependence on the input channel to be switched through and the sensor connected thereto, the electronic analog signal switch device (electrical multiplexer) for establishing the channel, the amplifier range of a programmable amplifier connected upstream of the analog-digital converter, the selection of individual linearisation functions related to the type of sensor and the calculation of the desired physical parameters can be established. By way of example the channel-individual setting of the programmable amplifier can be used to set the gain value very high upon the connection of a thermocouple element as that sensor delivers a very low voltage in the millivolt range. The recorded, sensor-dependent linearisation function takes account of a possibly present, non-linear characteristic of the respective sensor, which permits it to convert the detected sensor signal into the output value of the desired physical parameter. By way of example, in the case of a connected pressure sensor which delivers a 4-20 mA signal, the underlying physical parameter can be calculated in the range by way of example of 0-10 bars.

In terms of the method the foregoing object according to the invention is attained by a method of operating a multi-channel measurement data acquisition apparatus, wherein the analog input assembly is kept potential-free as long as no channel is switched through to the analog-digital converter by means of the electronic analog signal switch device, wherein in the case of a channel being switched through to the analog-digital converter the ground reference of the switched-through analog signal is assumed by the analog input assembly.

Figure 2:
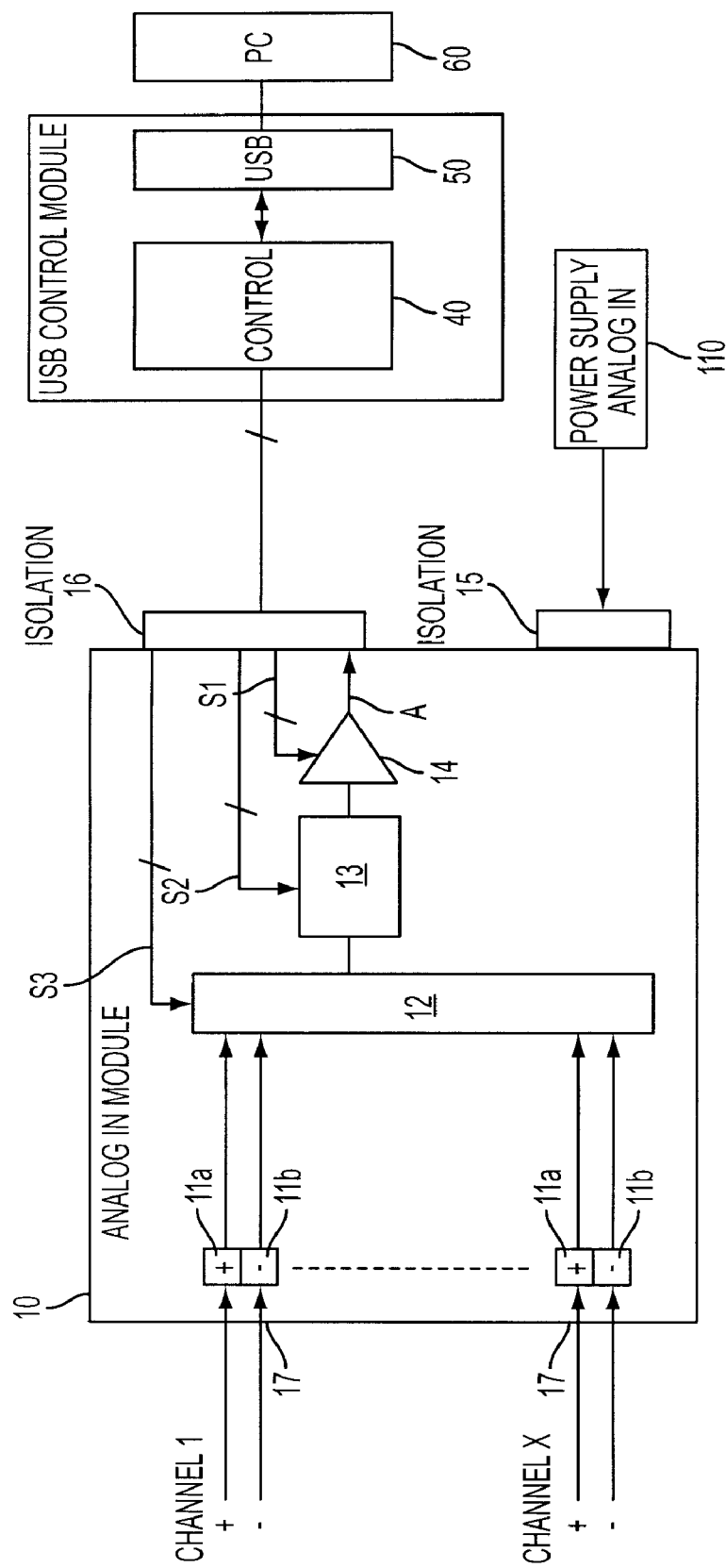
Figure 3:
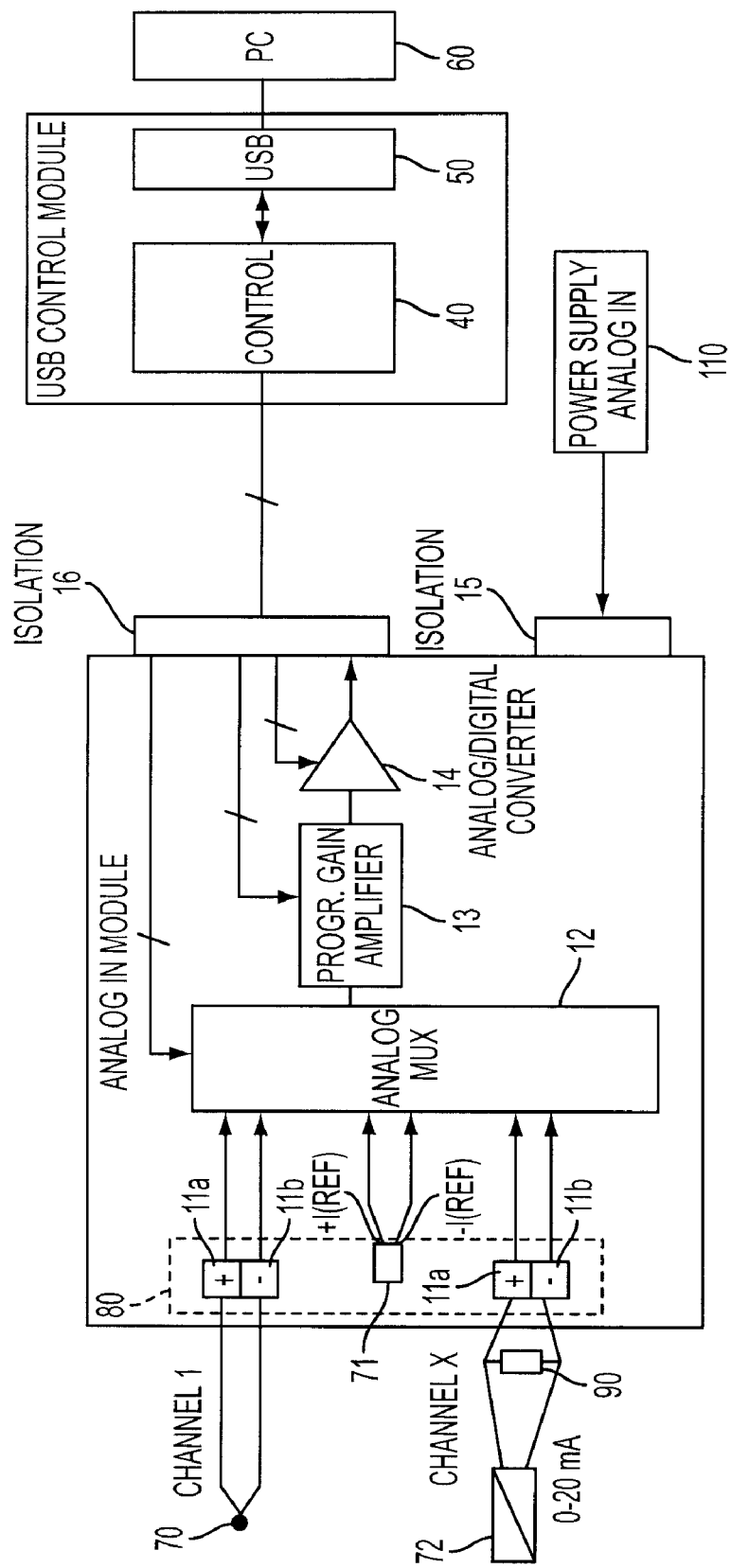
Figure 4:
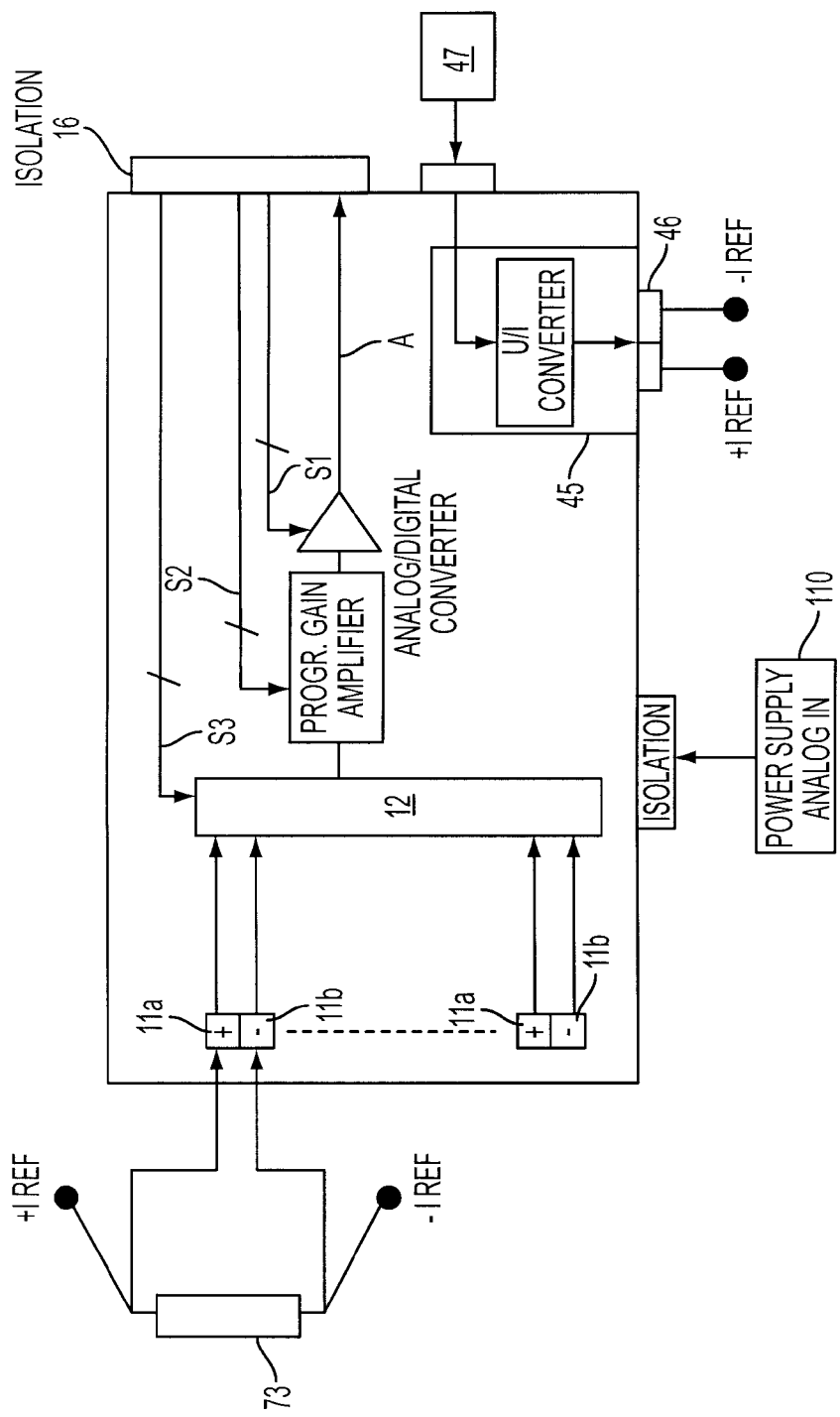

The invention is described hereinafter by means of the description of some embodiments with reference to the accompanying Figures wherein:

FIG. 1 shows a diagrammatic view of a measurement data acquisition apparatus according to the invention, FIG. 2 shows an assembly of the apparatus shown in FIG. 1 with terminals for the connection of sensors, FIG. 3 shows a slightly modified embodiment of the assembly shown in FIG. 2, and FIG. 4 shows an assembly with connected temperature sensor in which constant current flow is afforded by the apparatus.

FIG. 1 diagrammatically shows a measurement data acquisition apparatus 1 designed in accordance with the invention, having an assembly 10 with 32 analog input channels, an assembly 20 having two analog output channels and an assembly 30 with 32 digital in/output channels. In the described embodiment the assemblies are each connected to a central control device 40 which in turn is connected by way of a USB controller 50 to an external computer such as a PC 60.

The analog input assembly 10 has 32 inputs, of which those which are used are respectively connected to a connecting terminal device 11. In that respect the analog input assembly 10 can provide in total 16 differential inputs. The analog input assembly 10 has an electronic analog signal switch device 12 in the form of a multiplexer which connects the maximum 32 connected channels (or 16 differential channels) successively to the input of an analog amplifier 13, the output of which is connected to an analog-digital converter 14.

The assembly 10 is fed by a voltage supply 110, wherein a galvanic decoupling device 15 in the form of an isolating transformer provides that the voltage supply of the assembly 10 does not have a reference to ground. There is also a control and signal isolation device 16 which galvanically decouples the signals exchanged between the digital-analog converter 14 and the control device 40, for example by means of optocouplers.

The described measures in regard to the design configuration of the analog input assembly 10 ensure that the analog input assembly is galvanically decoupled from ground as long as no input channel is connected by means of the multiplexer 12 to the amplifier 13 or the analog-digital converter 14 respectively. For that purpose the assembly itself is also insulated in relation to the housing of the measurement data acquisition apparatus 1. The described measures provide a state of an assembly 10 which 'floats' in relation to the ground potential. If in contrast one of the signals at the channels is switched through by means of the multiplexer 12, the analog input assembly 10 assumes the ground reference of the analog signal that is switched through. In that way it is possible to avoid the ground loops which occur in conventional measurement data acquisition apparatuses.

The measurement data acquisition apparatus shown in FIG. 1 also has an analog output assembly 20 which in the described embodiment has a connecting terminal device 21 providing two differential analog output channels. For that purpose the assembly 20 has a digital-analog converter 23 controllable by the control device 40 and a downstream-connected U/I converter 22 connected at the output side to the connecting terminal device 21. To avoid the described ground loops, the assembly 20 is also galvanically coupled in respect of its voltage supply 120 by means of a decoupling device 24 such as an isolating transformer. In addition, provided between the control device 40 and the assembly 20 is an optocoupler device 25 for galvanic decoupling thereof.

The digital I/O assembly 30 has a digital 32-channel I/O device 32 for the output and input respectively of digital signals, which on the one hand is connected by way of a decoupling device such as an optocoupler device 34 to the control device 40 and which on the other hand is connected to a predetermined number of connecting terminal devices 31.

In the described embodiment the connecting terminal devices 21, 11, 31 are not fixedly connected to the individual assemblies 10, 20, 30 but are freely configuratable so that the apparatus can be adapted in highly flexible manner to the respective task for which it is to be used. In that way it is ultimately possible to save on connecting terminals as in general there is no need for all internally connectable channels to be passed outwardly.

In an embodiment which is not shown here it can also be provided that the connecting terminals can be connected in freely configuratable fashion by means of an electronically controllable switching device, to the respective outputs and inputs of the assemblies 10, 20 and 30.

The measurement data acquisition apparatus shown in FIG. 1 further includes a U/I converter adapted to output a constant current, for example for supplying current to a PT100 or PT1000.

To prevent the ground references of a plurality of sensors connected to the analog input assembly by way of different channels being coupled in the multiplexer 12, it has, between its individual analog signal switches, a high dielectric strength which is greater than the admissible potential difference of the individual channels, see FIG. 2 in which the analog input assembly is illustrated. Each differential input channel 17 includes two input lines connected to the two terminals 11a, 11b of the associated connecting terminal device 11. The analog signal multiplexer 12, the analog amplifier 13 and the analog-digital converter 14 are actuated in galvanically isolated relationship by the control device 40 by way of control lines S1, S2, in dependence on the measurement signal delivered by the respective sensor.

The respective channel-related and thus sensor-related control parameters are preselected by the user and for example called up from a memory and set, in the context of execution of a measurement data acquisition program. By way of example, the program running on the PC 60 can implement dialogs which permit the user to individually configure each channel, this being essentially established by which sensor is connected to the respective analog input, and which physical parameter forms the underlying basis for the measurement procedure.

FIG. 3 shows the assembly illustrated in FIG. 2 in a situation of use in which three sensors 70, 71 and 72 are each connected in double-pole relationship to the multiplexer 12. In the FIG. 3 embodiment the measurement data acquisition apparatus additionally has a metal plate 80 of a material of high thermal conductivity, wherein the connecting terminals 11a, 11b are mounted with a low heat-transmission resistance to the plate 80, for example by means of a thermally conducting adhesive. The plate acts in that respect as a heat bath so that all connecting terminals coupled thereto are at the same temperature. That embodiment is particularly suitable in those cases in which a plurality of thermocouple elements are connected for detecting different temperatures at different locations. The voltage signal delivered by such thermocouple elements is dependent on the temperature difference between the actual measurement location, identified by reference 70 in the Figure, and a comparative location which in the described embodiment is afforded by the plate 80. In that respect, to calculate the absolute temperature at the measurement location, knowledge about the temperature at the comparative location, that is to say the plate 80, is necessary. For that purpose, the described measurement data acquisition apparatus provides a temperature-dependent resistor 71 in thermal contact with the plate 80, through which flows a reference current IRef, and at which therefore there is dropped a temperature-dependent voltage which is applied by way of an internal channel to an input of the multiplexer 12. The Figure shows only one single thermocouple element 70, in principle it is possible to connect a large number of such thermocouple elements, wherein only one single temperature reference measurement has to be implemented by means of the temperature sensor 71.

Besides the described thermocouple elements it is also readily possible to additionally connect other sensors. FIG. 3 shows a pressure sensor 72 which, in dependence on the pressure obtaining at the measurement location, delivers a direct current which at a shunt 90 produces a voltage which is passed by means of a further measurement channel to the multiplexer 12.

As shown in FIG. 4 the measurement data acquisition apparatus can also have a device 45 in the form of a controllable U/I converter for providing a predetermined constant current IRef which can output by way of the connecting terminal 46 to an external sensor, for example a temperature-dependent resistor 73 in the form of a PT100 or PT1000. In that case the U/I converter 45 is fed by a suitable supply 47.

As already described hereinbefore in the analog input assembly 10 the multiplexer, the analog amplifier as well as the analog-digital converter are respectively adapted to the respectively connected sensor in accordance with the channel to be switched through. In addition the acquired digitised measurement signal A (FIG. 2) is subjected to data processing by way of linearisation functions which are stored in sensor type-dependent relationship in the memory of the control device to compensate in particular for non-linear characteristics of the sensor. The values ascertained in that way of the measured physical parameters are then available for further processing, storage, display and so forth. The described adaptation operation can be carried out depending on the respective design configuration involved both by the control devices 40, 50 or in the external PC 60.

LIST OF REFERENCES 1 measurement data acquisition apparatus
10 analog input assembly
11 connecting terminal device
11a, 11b terminal
12 analog signal switch device, multiplexer
13 analog amplifier
14 analog-digital converter
15 decoupling device, isolating transformer
16 control and signal isolation device
17 channel
20 analog output assembly
21 connecting terminal device
22 U/I converter
23 D/A converter
24 decoupling device, isolating transformer
25 decoupling device, optocoupler device
30 digital I/U assembly
31 connecting terminal device
32 digital I/O device
33 decoupling device
34 decoupling device, optocoupler
40 control device
45 U/I converter
46 connecting terminal device
47 supply of the U/I converter
50 USB controller
60 PC
70,71,72,73 sensor
80 heat-conducting plate
90 shunt
110 voltage supply for assembly 10
120 voltage supply for assembly 20
130 voltage supply for assembly 30
S1,S2,S3 control line/control signal
A digitised measurement signal
IRef constant current

What is claimed is:

1. A multi-channel measurement data acquisition apparatus comprising:
   at least one analog input assembly having a plurality of analog inputs, each of said plurality of analog inputs associated with an individual channel of a plurality of channels;
   a controllable electronic analog signal switch device; and
   a central controllable analog-digital converter, wherein the plurality of channels associated with the plurality of analog inputs are configured to be successively switched through by the controllable electronic analog signal switch device so that analog signals received at the analog inputs of the individual channels are successively applied as input signals to the central controllable analog-digital converter, and wherein the controllable electronic analog signal switch device and/or the central controllable analog-digital converter have control inputs connected to associated control lines;
   wherein a supply voltage of the at least one analog input assembly, the control lines of the controllable electronic analog signal switch device and of the central controllable analog-digital converter, and an output of the central controllable analog-digital converter are respectively galvanically decoupled from ground so that after an analog signal is switched through to the central controllable analog-digital converter the at least one analog input assembly assumes ground reference of the switched-through analog signal.

2. A multi-channel measurement data acquisition apparatus as set forth in claim 1, wherein the controllable electronic analog signal switch device comprises a plurality of individual analog signal switches, and wherein the controllable electronic analog signal switch device has between the plurality of individual analog signal switches a high dielectric strength which is greater than a respective admissible potential difference of the individual channels.

3. A multi-channel measurement data acquisition apparatus as set forth in claim 1, comprising an analog output assembly having a plurality of analog outputs and a digital I/O assembly, wherein said analog output assembly and said digital I/O assembly are galvanically decoupled in relation to the analog input assembly.

4. A multi-channel measurement data acquisition apparatus as set forth in claim 1, comprising an analog output assembly having a plurality of analog outputs and a digital I/O assembly, wherein said analog output assembly and said digital I/O assembly are potential-decoupled in relation to the analog input assembly.

5. A multi-channel measurement data acquisition apparatus as set forth in claim 1, wherein said measurement data acquisition apparatus has a predetermined number of connecting devices, that is less than a total number of inputs and outputs of said included input/output assemblies, wherein said connecting devices can be configuratably connected to the inputs and outputs of said included input/output assemblies.

6. A multi-channel measurement data acquisition apparatus as set forth in claim 5, wherein the connecting devices are switched by a controllable switching device to the inputs and outputs of the included input/output assemblies.

7. A multi-channel measurement data acquisition apparatus as set forth in claim 5, further comprising releasable connections between the connecting devices and the inputs and outputs of the included input/output assemblies, wherein the analog input channels and the digital inputs and outputs are each distributed half to the connecting devices.

8. A multi-channel measurement data acquisition apparatus as set forth in claim 1, wherein said measurement data acquisition apparatus has a predetermined number of connecting devices, of which at least two are thermally coupled with a low heat-transmission resistance to a heat-conductive plate, wherein said multi-channel measurement data acquisition apparatus further comprises a sensor configured to measure the temperature of said heat-conductive plate, and wherein the at least two connecting devices are configured to connect thermocouple elements and wherein measurements of the at least two connected thermocouple elements are calculated with a temperature value at the same time of a temperature sensor for ascertaining absolute temperature values.

9. A multi-channel measurement data acquisition apparatus as set forth in claim 1, further comprising at least one current reference source which supplies a constant current to a temperature-dependent resistor.

10. A multi-channel measurement data acquisition apparatus as set forth in claim 1, further comprising a program configured to control said multi-channel measurement data acquisition apparatus by a control device, a USB controller and/or a PC connected to the multi-channel measurement data acquisition apparatus by way of the USB controller, whereby each channel is configured to be individually configured based on a sensor connected thereto.

11. A multi-channel measurement data acquisition apparatus as set forth in claim 10, wherein the electronic analog signal switch device to establish the channel, an amplifier range of a programmable amplifier connected upstream of the central controllable analog-digital converter, a selection of individual linearization functions related to the respective type of sensor and calculation of a desired physical parameter is controllable based on the channel to be switched through and the sensor connected thereto.

12. A method of operating a multi-channel measurement data acquisition apparatus which includes a central analog-digital converter and at least one analog input assembly having a plurality of analog inputs, each of said plurality of analog inputs associated with an individual channel of a plurality of channels, said method comprising:

switching channels of the analog inputs successively through by an electronic analog signal switch device so that analog signals at the analog inputs of the individual channels are successively passed to said central analog-digital converter and are digitised thereby;

keeping the analog input assembly potential-free as long as no channel is switched through to the analog-digital converter by means of the electronic analog signal switch device; and assuming ground reference of a switched-through analog signal by the analog input assembly in the case of a channel being switched through to the analog-digital converter.

* * * * *